US008941547B2

(12) United States Patent
Cho et al.

(10) Patent No.: US 8,941,547 B2
(45) Date of Patent: Jan. 27, 2015

(54) DIPLEX FILTER FOR TESTING BASE SYSTEM

(75) Inventors: Hak Rae Cho, Incheon (KR); Hyo Chul Kim, Bucheon-si (KR)

(73) Assignee: Innertron Co., Ltd., Incheon (KR)

( * ) Notice: Subject to any disclaimer, the term of this patent is extended or adjusted under 35 U.S.C. 154(b) by 0 days.

(21) Appl. No.: 14/123,061

(22) PCT Filed: Mar. 22, 2012

(86) PCT No.: PCT/KR2012/002062
§ 371 (c)(1),
(2), (4) Date: Nov. 27, 2013

(87) PCT Pub. No.: WO2013/118939
PCT Pub. Date: Aug. 15, 2013

(65) Prior Publication Data
US 2014/0340268 A1    Nov. 20, 2014

(30) Foreign Application Priority Data

Feb. 6, 2012  (KR) ..................... 10-2012-0011575

(51) Int. Cl.
*H01Q 1/00*      (2006.01)
*H03H 9/46*      (2006.01)

(52) U.S. Cl.
CPC ...................................... *H03H 9/46* (2013.01)
USPC ....................................................... 343/722

(58) Field of Classification Search
CPC ..... H01Q 5/00; H01Q 5/0034; H01Q 5/0003; H01Q 9/145; H01Q 9/16
USPC .......... 343/722, 840, 756, 786, 772; 455/328, 455/188
See application file for complete search history.

(56) References Cited

U.S. PATENT DOCUMENTS

| 5,959,592 | A  | * | 9/1999  | Petruzzelli ....................... 725/68 |
| 6,873,225 | B2 | * | 3/2005  | Spielman et al. ............. 333/126 |
| 8,009,725 | B2 | * | 8/2011  | Petrovic et al. ................ 375/220 |
| 8,779,872 | B2 | * | 7/2014  | Jackson et al. ................ 333/126 |
| 2011/0243043 | A1 | * | 10/2011 | Jackson et al. ................ 370/297 |

FOREIGN PATENT DOCUMENTS

JP       07-336267 A    12/1995
JP       2007-174586 A   7/2007
(Continued)

OTHER PUBLICATIONS

International Search Report dated Feb. 7, 2013 received in International Application No. PCT/KR2012/002062.
(Continued)

*Primary Examiner* — Huedung Mancuso
(74) *Attorney, Agent, or Firm* — Knobbe, Martens, Olson & Bear, LLP

(57) ABSTRACT

An diplex filter for testing a base station is disclosed. The diplex filter for testing a base station in accordance with an embodiment of the present invention includes: a housing comprised with a first connector and a second connector which are connected to a base station, and a third connector connected with the antenna, wherein the first, the second and the third connectors bi-directionally transmit/receive signals; a band pass filter unit comprised in one inside in the housing, transmitting signals between the first and third connectors to pass predetermined frequency bands; a band reject filter unit comprised in the other inside in the housing, transmitting signals between the second and third connectors to reject predetermined frequency bands; and a coupling block disposed between the band pass filter unit and the band reject filter unit, and coupled the band pass filter unit and the band reject filter unit with the third connector, and to move the signal distortion phenomenon occurring due to unnecessary signals included in the signals to frequency bands other than predetermined frequency bands.

7 Claims, 8 Drawing Sheets

(56) References Cited

FOREIGN PATENT DOCUMENTS

| | | |
|---|---|---|
| KR | 10-2005-0000953 A | 1/2005 |
| KR | 10-2010-0134324 A | 12/2010 |

OTHER PUBLICATIONS

International Preliminary Report on Patentability dated Aug. 12, 2014 received in International Application No. PCT/KR2012/002062.

* cited by examiner

DIPLEX FILTER FOR TESTING BASE SYSTEM

TECHNICAL FIELD

The present invention relates to a filter for testing a base station—more specifically, a diplex filter for testing a base station comprised with a band pass filter unit and a band reject filter unit inside one housing.

BACKGROUND ART

In general mobile communication systems, a base station (BS) consists of a base transceiver station (BTS) that transmits and receives high-frequency wireless signals and a base station controller (BSC) that controls all operations of BS. For instance, BTS is a device composed of wireless transceivers, communicating with terminals through wireless links. BSC manages a plurality of BTSs; it is in charge of wireless channel setting, frequency hopping, handover, etc.

According to FIG. 1, mobile communication systems (2) are comprised of BSs (10) and antennas (20). BSs (10) are inclusive of BTSs and are controlled through BSCs. These mobile communication systems (2) test the signal transmitted/received by BTSs (10), identify the frequency characteristics, etc., of the transmitted/received high-frequency signals to determine whether the signals are normal, and take countermeasures when faults have occurred. During BTS (10) testing, however, signal distortions frequently occur in the transmitted/received high-frequency signals due to unnecessary signals, making the tests inaccurate because the signal distortion phenomenon occurs in certain frequency bands needed by BTS (10).

SUMMARY

The present invention is to provide a diplex filter for testing a base transceiver station.

An aspect of the present invention features a diplex filter for testing a base station, which includes: a housing comprised with a first connector and a second connector which are connected to a base station, and a third connector connected with the antenna, wherein the first, the second and the third connectors bi-directionally transmit/receive signals; a band pass filter unit comprised in one inside in the housing, transmitting signals between the first and third connectors to pass predetermined frequency bands; a band reject filter unit comprised in the other inside in the housing, transmitting signals between the second and third connectors to reject predetermined frequency bands; and a coupling block disposed between the band pass filter unit and the band reject filter unit, and coupled the band pass filter unit and the band reject filter unit with the third connector, and to move the signal distortion phenomenon occurring due to unnecessary signals included in the signals to frequency bands other than predetermined frequency bands.

The band pass filter unit may include: a plurality of cavities formed by the grooves formed between the first and third connectors in the housing in the direction from the top surface to the bottom of the housing; a plurality of resonators installed in each of the cavities; and a plurality of partitions formed to partially open to form windows and configured to couple the cavities adjacent to each other.

The resonator of the cavity may be disposed at the last position of the signal transmission path between the first and third connectors among the cavities is coupled with the coupling block in an open type to be connected electrically to the third connector.

The coupling block may include: a cross cavity coupled with the resonator of the cavity located at the last position of the band pass filter unit; a cross resonator disposed in the cross cavity; a partition formed to partially open to form a window between the cavity located at the last position of the band pass filter unit and the cross cavities; and a cross transmission line coupled with the cross resonator in the cross cavity to be connected electrically to the third connector. The diplex filter for testing a base station may also include a dielectric material disposed between outer circumference surface of the cross resonator and the cross transmission line, wherein the dielectric material increases the amount of coupling.

The band reject filter unit may include: a plurality of cavities formed by the grooves formed between the first and third connectors in the housing in the direction from the top surface to the bottom of the housing; a plurality of resonators installed in each of the cavities; a plurality of partitions that are partially open to form windows so that the cavities adjacent to each other can be coupled; and a plurality of transmission lines installed on the windows and arranged side by side on one side of the resonators so that signals can be transmitted between the second and third connectors.

The housing may also include a plurality of passageways to couple some of the cavities of the band reject filter, wherein the passageways respectively comprise a connection bar that is connected to the transmission lines and installed inside the passageways.

DETAILED DESCRIPTION

Figure 1:
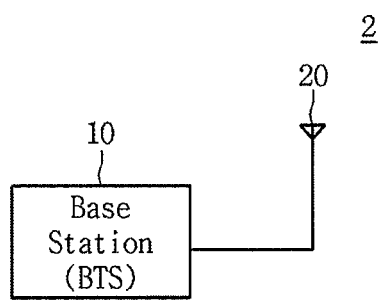
FIG. 1 illustrates the construction of base stations and antennas in general mobile communication systems.

The examples of embodiment of the present invention can be modified into various forms, and the scope of the present invention should not be interpreted as being limited to the examples of embodiment described below. These examples of embodiment are provided to explain the present invention more completely to those who have average knowledge in the industry. Therefore, the shapes of components, etc., in the drawings have been exaggerated for clearer explanations.

Hereinafter, referring to attached FIGS. 2 to 9, the examples of embodiment of the present invention are explained in detail.

Figure 2:
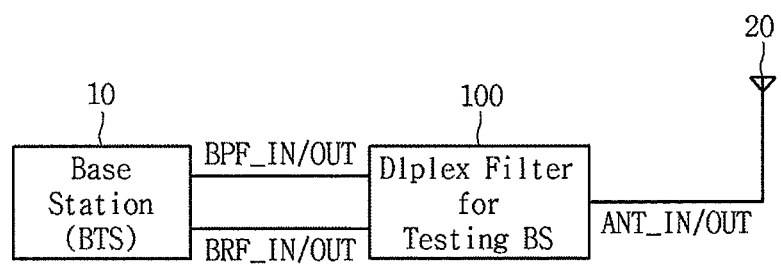
FIG. 2 shows the connection construction of the diplex filter for testing a base station in the present invention.
Figure 3:
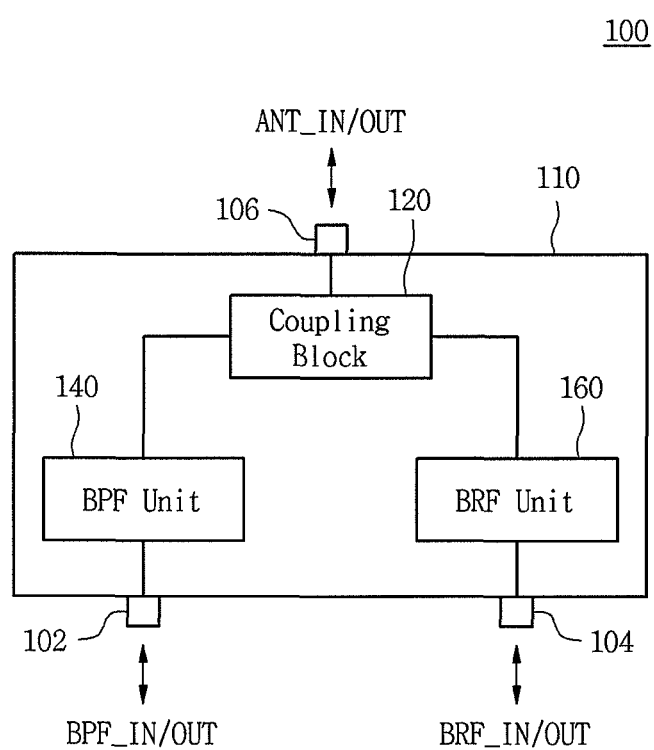
FIG. 3 illustrates the construction of the diplex filter for testing a base station illustrated in FIG. 2.

FIG. 2 illustrates the connection construction of the diplex filter for testing a base station in the present invention; FIG. 3 shows the construction of the diplex filter for testing a base station illustrated in FIG. 2.

According to FIGS. 2 and 3, the diplex filter for testing a base station (100) is intended to test the performance of BTS (10) and is connected between BTS (10) and the antenna (20). The diplex filter for testing a base station (100) is comprised of a housing (110), a band pass filter (BPF) unit (140), a band reject filter (BRF) unit (160), and a coupling block (120).

The band pass filter unit (140) is intended to pass certain desired frequency bands, and the band reject filter unit (160), to examine the levels of noise in signals in the passed frequency bands. Therefore, the band reject filter unit (160) is designed to pass all signals in low frequency and high frequency bands except the pass bands to enable identifying the noise signals outputted from BTS (10) without any distortion phenomenon.

The coupling block (120) is constructed to connect electrically the band pass filter unit (140) and the band reject filter unit (160) to the one connector (106) connected to the antenna (20).

Concretely, as illustrated in FIG. 3, the diplex filter for testing a base station (100) is provided with a band pass filter (BPF) unit (140), a band reject filter (BRF) unit (160), and a coupling block (120) in one housing (110). The housing (110) is comprised with the first and second connectors (102, 104) connected to BTS (10) and a third connector (106) connected to the antenna (20). The first to third connectors (102-106) are provided as input terminals or output terminals according to signal input/output (BPF_IN/OUT, BRF_IN/OUT, ANT_IN/OUT).

The diplex filter for testing a base station (100) in the present invention is disposed with a band pass filter unit (140) and a band reject filter unit (160) in one housing (110) and connected to cross one connector (106) through the coupling block (120).

Figure 4:
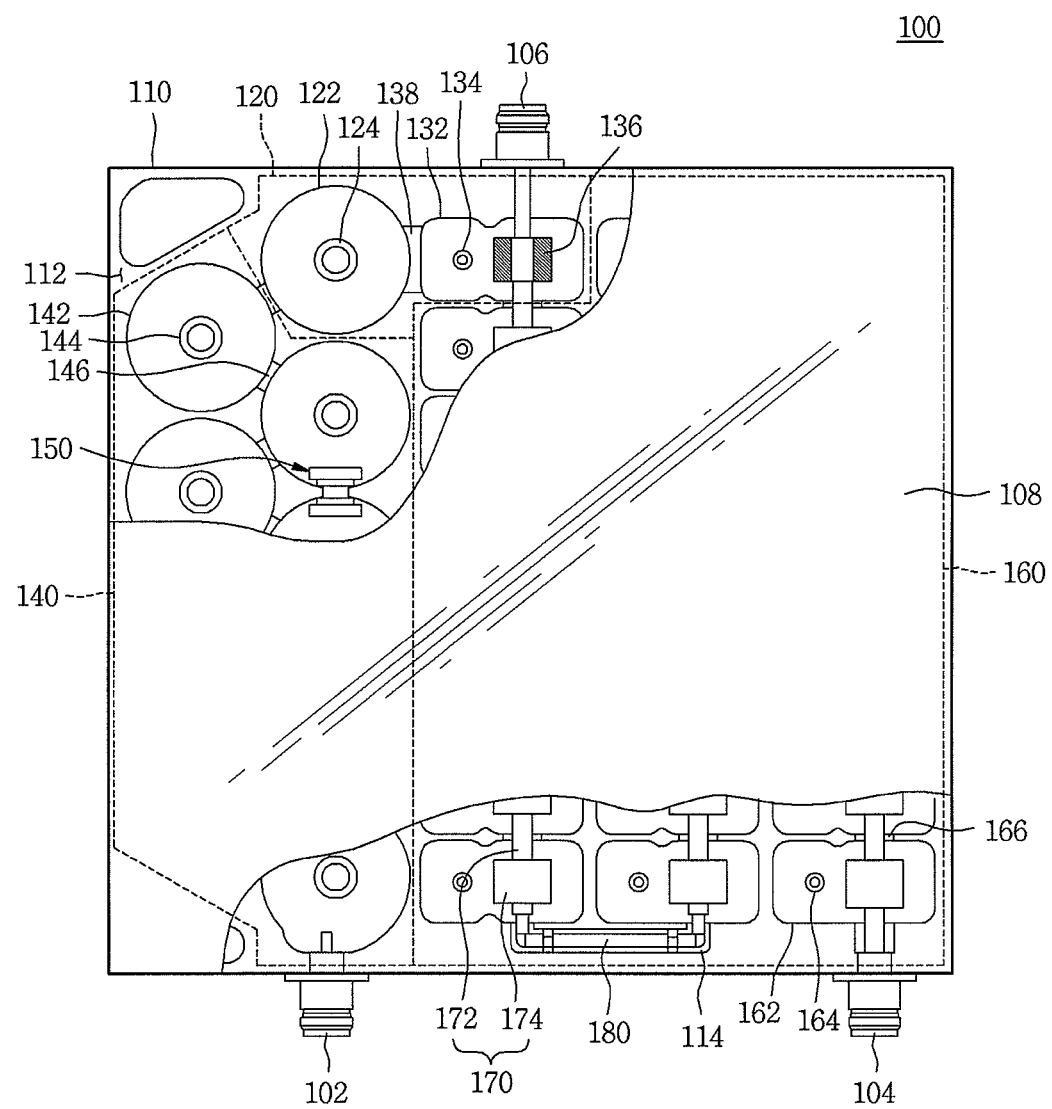
FIG. 4 shows the construction of the diplex filter for testing a base station according to the first example of embodiment of the present invention.
Figure 5:
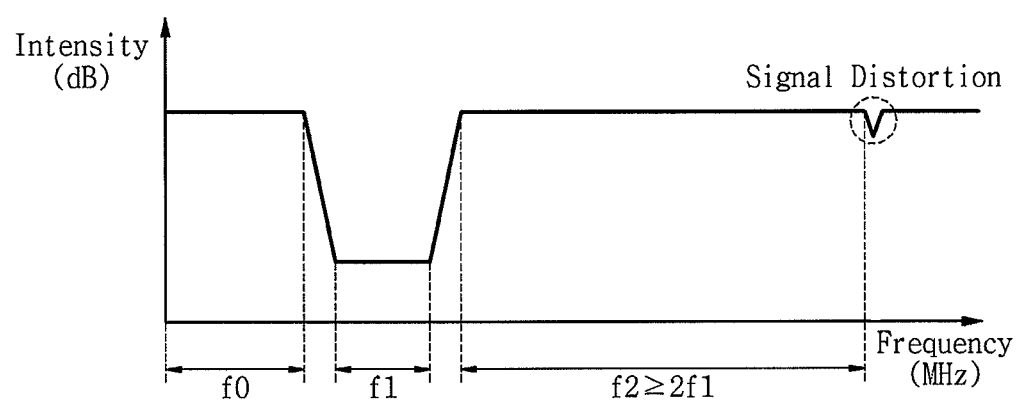
FIG. 5 is a wave form diagram showing the frequency characteristics of the diplex filter illustrated in FIG. 4.

FIG. 4 illustrates the construction of the diplex filter for testing a base station according to the first example of embodiment of the present invention; FIG. 5 is a wave form diagram showing the frequency characteristics of the diplex filter illustrated in FIG. 4.

According to FIGS. 4 and 5, the diplex filter (100) in this example of embodiment is disposed with a band pass filter unit (140), a band reject filter unit (160), and a coupling block (120) in one housing (110). A cover (108) is attached to the top of the housing (110).

The band pass filter unit (140) transmits signals between the first and third connectors (102, 106) to pass signals in certain frequency bands. Toward this end, the band pass filter unit (140) forms a plurality of cavities (142) inside the housing (110) and disposes a resonator (144) in each of the cavities (142). Each of the cavities (142) is provided by forming a long groove from the top surface (112) to the bottom of the housing (110). Therefore, partitions are formed between the cavities (142). In this example of embodiment, each of the cavities (142) is provided in cylinder form.

The band pass filter unit (140) connects the resonator (144) installed in one cavity (142) adjacent to the first connector (102) to the wire of the first connector (102) in short type or open type. In this example of embodiment, the 50 ohm wire of the first connector (102) and the resonator (144) are provided in an open type. The cavity (122) located at the last position of the band pass filter unit (140) is electrically connected to the third connector (106) through the coupling block (120).

Windows (146) are formed in the partitions to form signal transmission paths between cavities adjacent to each other. In this example of embodiment, the cavities (142) transmit signals in the directions of formation of the windows (146), for instance, in zigzags. Therefore, the cavity (122) located at the last position of the band pass filter unit (140) is electrically connected to the third connector (106) through the coupling block (120).

Some of the cavities (142) are equipped with a notch generating device (150) that improves capacitance notches to generate notches between the relevant cavities selectively. Of course, some of the other cavities (142) may be additionally comprised with a notch generating device (not illustrated) that improves inductance notches.

The band reject filter unit (160) is disposed on the other side of the band pass filter unit (140) inside the housing (110). The band reject filter unit (160) stops certain frequency bands when signals are transmitted between the second connector (104) and the third connector (106). Toward this end, the band reject filter unit (160) forms a plurality of cavities (162) in the housing (110). Each of the cavities (162) is provided by forming a long groove from the top surface (112) to the bottom of the housing (110). The cavities (162) have partitions wherein windows (166) have been formed to form signal transmission paths between cavities adjacent to each other. The partitions are equipped with transmission lines (170) on their windows (166) for signal transmission between the second and third connectors (104, 106).

In this example of embodiment, each of the cavities (162) is generally provided in the form of a rectangular parallelepiped. Each of the cavities (162) is equipped with a resonator (164).

The cavities (162) are arranged to form a plurality of rows and columns. Therefore, a plurality of passageways (114) that connect between cavities located at two ends of each row (or column) are formed in the housing (110) for signal transmission between cavities arranged in different rows (or columns). The band reject filter (160) is equipped with transmission lines (170) on one side of the resonators (164). The transmission lines (170) are installed on windows (166), which are partial openings of the partitions, and are arranged side by side with the resonators (164). The transmission lines (170) are also connected to the connection bars (180) inserted into the inside of the passageways (114) to couple the relevant resonators.

The transmission lines (170) are formed from a metal material, for instance, and the two ends of each are electrically connected to the second and third connectors (104, 106) in the housing (110). These transmission lines (170) have structures that include coaxial lines (172) electrically connecting the second and third connectors (104, 106) and capacitive conductors (174) arranged so that their outer circumference surfaces are at a certain distance from the side of each of the resonators (164). The coaxial lines (172) are located on the partition windows (166), and the capacitive conductors (174) are arranged at locations corresponding to the sides of the resonators (164). In other words, the capacitive conductors (174) are disposed on the coaxial lines (172) at locations where resonators (164) are arranged on one side. The capacitive conductors (174) are formed in the form of cylinders extended laterally from the central axis of the coaxial lines (172) to have larger diameters than the coaxial lines (172).

The band reject filter unit (160) may also comprise with a plurality of transmission line supporting materials (not illustrated) installed in some of the partitions to support the transmission lines (170) on the windows (166).

The band reject filter unit (160) also connects the resonator (164) installed in one cavity (162) adjacent to the second connector (104) and wire of the second connector (104) in short type or open type. In this example of embodiment, the wire of the second connector (104) and the resonator (162) are provided in a short type.

In the case of this band reject filter (160), the frequency bands to be stopped and the intensity of the stop bands can be adjusted according to the number of cavities (162), number of resonators (164), sizes of the resonators (164), thickness of the transmission lines (170), distances between the resonators (164) and the transmission lines (170), and cross-sectional area of the transmission lines (170).

The coupling block (120) is provided in an open type. In other words, the coupling block (120) is comprised of the following: a cross cavity (132) coupled with the resonator (124) of the cavity (122) located at the last position of the band pass filter unit (140) on the signal transmission path; a cross resonator (134) disposed in the cross cavity (132), and; a cross transmission line (136) electrically connected to the 50 ohm wire of the third connector (106) inside the housing (110). Although the cross cavity (132) in this example of embodiment is provided in the form of a rectangular parallelepiped, it can be provided in diverse forms such as cylinder form to adjust the desired amount of coupling and can be easily changed.

In the case of the coupling block (120), a window (138) is formed as a partial opening of the partition between the cavity (122) located at the last position of the band pass filter (140) and the cross cavity (132). Here, the cross transmission line (136) is provided in a form generally similar to the capacitive conductor (174) of the transmission lines (170). The cross transmission line (136) is equipped with a dielectric on its outer circumference surface in contact with the cross resonator (134) to increase the amount of coupling. This dielectric is formed from a Teflon material, for instance.

This coupling block (120) does not pass unnecessary signals, i.e., signals wherein signal distortions have occurred in low frequency and high frequency bands by comprising the cross cavity (132), cross resonator (134), and cross transmission line (136) between the band pass filter unit (140) and the band reject filter unit (160).

As illustrated in FIG. 5, the diplex filter (100) in this example of embodiment has the characteristics of passing good signals in low frequency bands (f0) (for instance, approximately 800-900 MHz) through the band pass filter unit (140) and passing good signals in the frequency bands (f2≥2f1) (for instance, 1800-2100 MHz) having two times or more frequency of the frequency bands (f1) stopped by the band reject filter unit (160). In this example of embodiment, the signal distortion phenomenon occurs in frequency bands exceeding approximately 4000 MHz.

In succession, the constructions of the diplex filter for testing a base station according to the second and third examples of embodiment of the present invention are explained in detail using FIGS. 6 to 9. Here, explanations of the same components as those of the first example of embodiment are omitted, and differences are mainly explained in detail.

Figure 6:
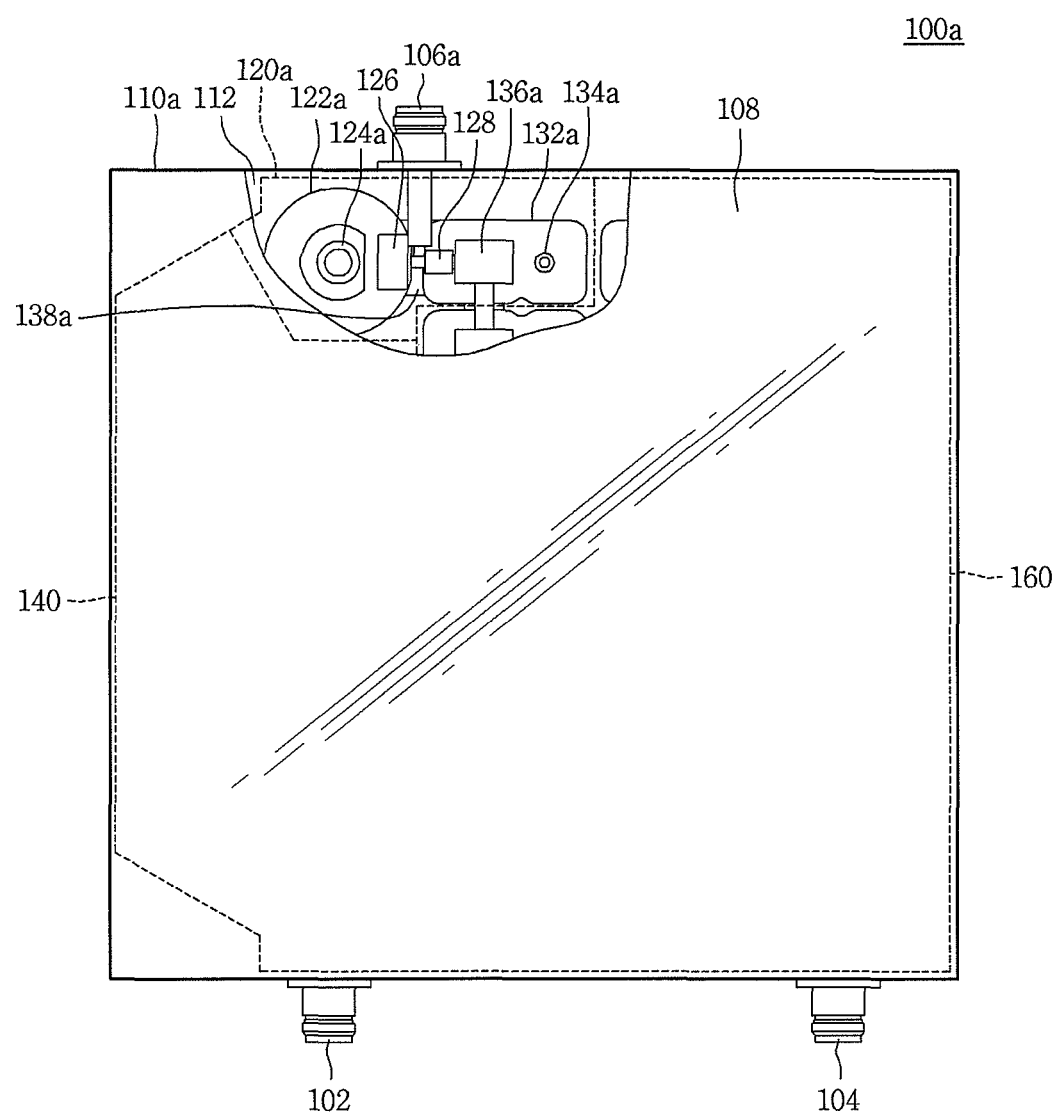
FIG. 6 illustrates the construction of the coupling block in the diplex filter for testing a base station according to the second example of embodiment of the present invention.
Figure 7:
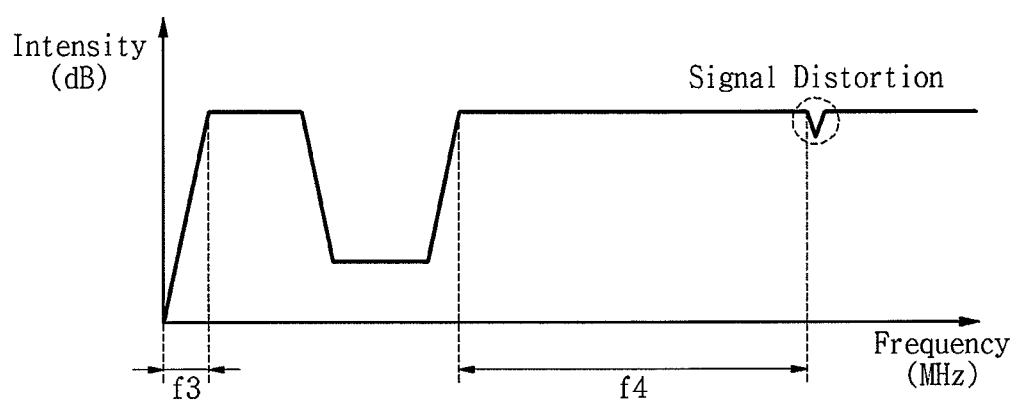
FIG. 7 is a wave form diagram showing the frequency characteristics of the diplex filter illustrated in FIG. 6.

Specifically, FIG. 6 illustrates the construction of the coupling block for the diplex filter for testing a base station according to the second example of embodiment of the present invention. FIG. 7 is a wave form diagram showing the frequency characteristics of the diplex filter illustrated in FIG. 6.

According to FIGS. 6 and 7, the diplex filter (100a) in this example of embodiment is comprised of a band pass filter unit (140), a band reject filter unit (160), and a coupling block (120a). The band pass filter unit (140) has a construction that is the same as or generally similar to that of the first example of embodiment. The band reject filter unit (160) has a construction that is generally the same as or similar to that of the first example of embodiment, but the locations of the resonators (164) and the transmission lines (170) are different.

The coupling block (120a) is provided in an open type. In other words, the coupling block (120a) is comprised of the following: a cross cavity (132a) coupled with the resonator (124a) of the cavity (122a) located at the last position of the band pass filter unit (140) on the signal transmission path; a cross resonator (134a) disposed in the cross cavity (132a), a cross transmission line (136a) electrically connected to the 50 ohm wire of the third connector (106a) inside the housing (110a), and; coupling units (126, 128). The coupling units (126, 128) includes a disk (126) coupled with the resonator (124a) at a certain distance in an open type and a coupling bar (128) equipped with the disk (126) on one end and attached to the cross transmission line (136a) on the other end. One side of the coupling bar (128) is attached to the wire of the third connector (106a) by soldering, etc. Here, dielectrics may be installed on the outer circumference surfaces of the coupling units (126, 128) to increase the amount of coupling. These dielectrics are formed from a Teflon material, for instance.

Although the cross cavity (132a) in this example of embodiment is provided in generally the same shape as that of the first example of embodiment, it can be provided in diverse shapes such as cylinder to adjust the desired amount of coupling and can be easily changed.

In the case of the coupling block (120a), a window (138a) is formed as a partial opening of the partition between the cavity (122a) located at the last position of the band pass filter (140) and the cross cavity (132a). The coupling bar (128) is installed on this window (138a). Here, the cross transmission line (136a) is provided in a form generally similar to the capacitive conductor (174) of the transmission lines (170).

This coupling block (120a) does not pass unnecessary signals, i.e., signals wherein signal distortions have occurred in the desired low frequency bands, by comprising the cross cavity (132a), cross resonator (134a), and cross transmission line (136a) between the band pass filter unit (140) and the band reject filter unit (160), and coupling the resonator (124a) of the cavity (122a) located at the last position of the band pass filter (140) and a disk (126) in an open type.

As shown in FIG. 7, the diplex filter (100) in this example of embodiment passes good signals in low frequency bands (f3) (for instance, approximately 500 MHz or lower) and in certain high frequency bands (f4) (for instance, 700-900 MHz) through the band pass filter unit (140) to enhance the characteristics of the passed frequency in low frequency bands of unnecessary signals by the open-type resonator (122a) and the disk (126).

In the case of the diplex filter (100a) in this example of embodiment, however, more signal distortions made by unnecessary signals occur in high frequency bands than in the case of the diplex filter (100) in the first example of embodiment. Therefore, the diplex filter (100a) in this example of embodiment can be said to be suitable for testing those BTSs (10) requiring low frequency bands.

Figure 8:
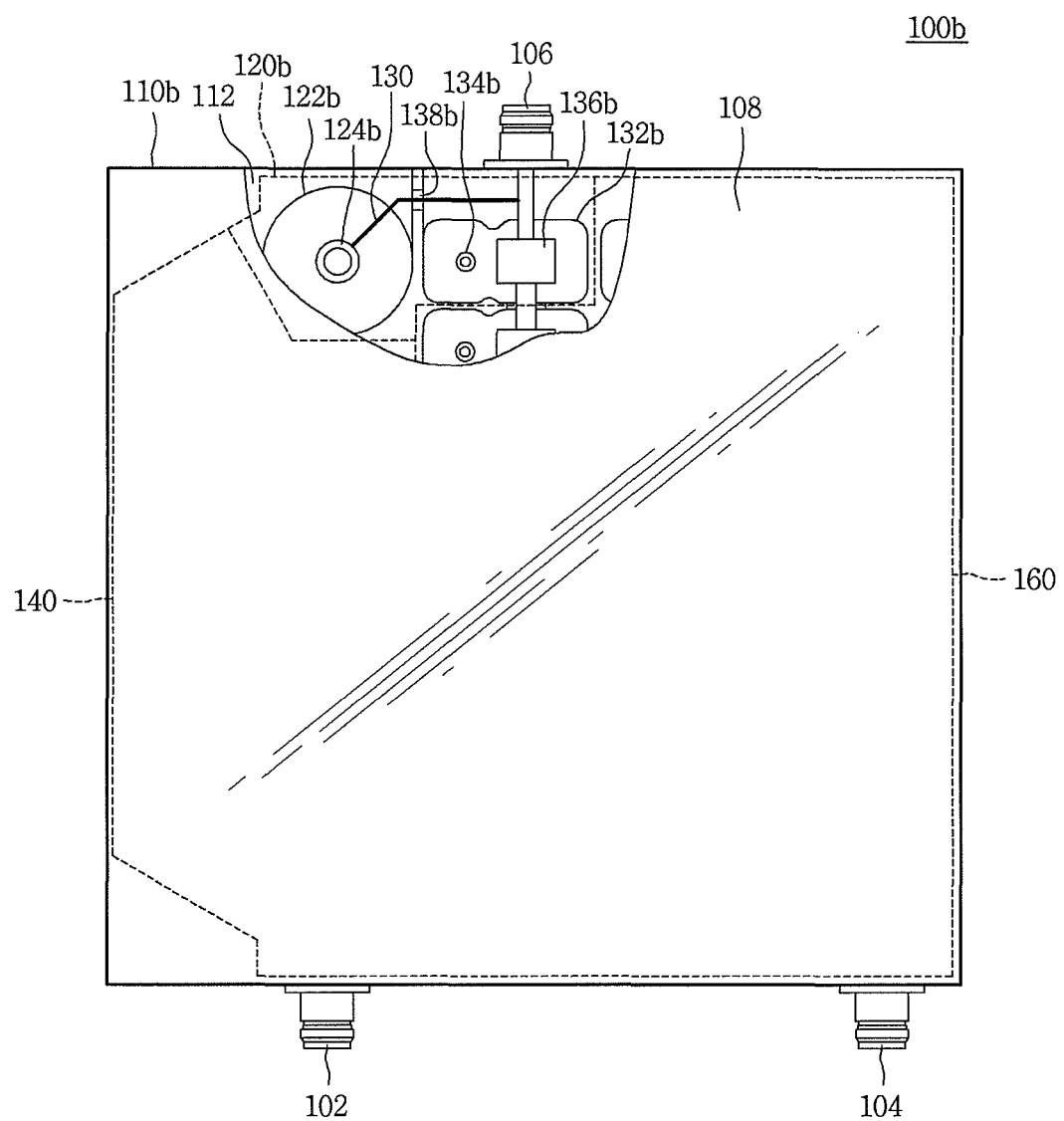
FIG. 8 illustrates the construction of the coupling block in the diplex filter for testing a base station according to the third example of embodiment of the present invention.
Figure 9:
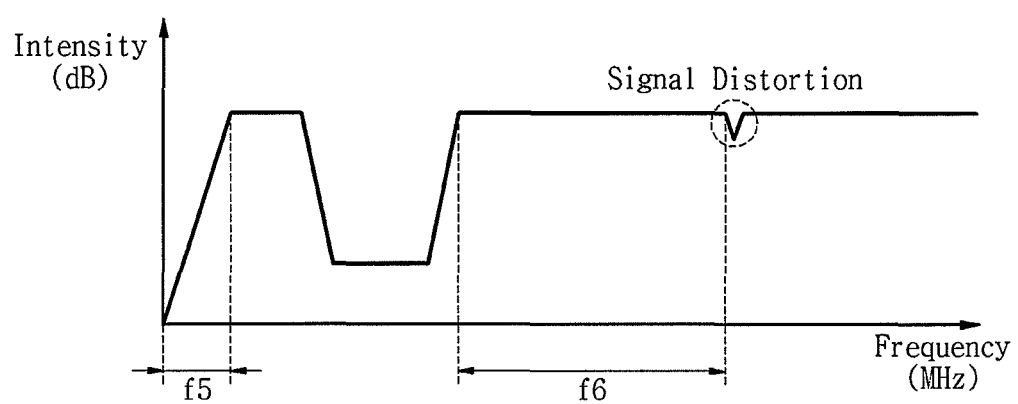
FIG. 9 is a wave form diagram showing the frequency characteristics of the diplex filter illustrated in FIG. 8.

FIG. 8 illustrates the construction of the coupling block for the diplex filter for testing a base station according to the third example of embodiment of the present invention. FIG. 9 is a wave form diagram showing the frequency characteristics of the diplex filter illustrated in FIG. 8.

According to FIGS. 8 and 9, the diplex filter (100b) in this example of embodiment is comprised of a band pass filter unit (140), a band reject filter unit (160), and a coupling block (120b). The band pass filter unit (140) and the band reject filter unit (160) have constructions that are generally the same as or similar to those in the first example of embodiment.

The coupling block (120b) is provided as a short type. In other words, the coupling block (120b) is comprised of the following: a cross cavity (132b) coupled with the resonator (124b) of the cavity (122b) located at the last position of the band pass filter unit (140) on the signal transmission path; a cross resonator (134b) disposed in the cross cavity (132b); a cross transmission line (136b) electrically connected to the 50 ohm wire of the third connector (106) inside the housing (110b), and: a coupling line (130). The coupling line (130) is attached to the resonator (124b) and the wire of the third connector (106) by soldering, etc. so that they are coupled in a short type.

Although the cross cavity (132b) in this example of embodiment is provided in a form generally similar to that of the first example of embodiment, it can be provided in diverse forms such as cylinder form to adjust the desired amount of coupling and can be easily changed.

In the case of the coupling block (120b), a window (138b) is formed as a partial opening of the partition between the cavity (122b) located at the last position of the band pass filter (140) and the cross cavity (132b). The coupling line (130) is installed on this window (138a).

This coupling block (120b) does not pass unnecessary signals, i.e., signals where signal distortions have occurred in the desired certain frequency bands, by coupling the resonator (124b) of the cavity (122b) located at the last position of the band pass filter (140) and the wire of the third connector (106) through the coupling line (130) between the band pass filter unit (140) and the band reject filter unit (160).

As illustrated in FIG. 9, the diplex filter (100b) in this example of embodiment prevents the signal distortion phenomenon from occurring in certain desired frequency bands. Although the signal distortion phenomenon occurs in certain low frequency bands (f5) (for instance, approximately 500 MHz or lower) and certain high frequency bands (for instance, approximately 2000 MHz or higher), the diplex filter (100b) does not pass signals where the signal distortion phenomenon occurs in certain desired frequency bands (for instance, approximately 500-2000 MHz). Therefore, the diplex filter (100b) in this example of embodiment is suitable for testing those BTSs (10) that require certain frequency bands.

Although the construction and actions of the diplex filter for testing a base station according to the present invention were described in detail and illustrated with drawings as above, these are only explanations with some examples of embodiment. The diplex filter for testing a base station in the present invention can be diversely changed and/or modified without veering away from the technical idea of the present invention.

The invention claimed is:

1. A diplex filter for testing a base station, comprising:
   a housing comprised with a first connector and a second connector which are connected to a base station, and a third connector connected with the antenna, wherein the first, the second and the third connectors bi-directionally transmit/receive signals;
   a band pass filter unit comprised in one inside in the housing, transmitting signals between the first and third connectors to pass predetermined frequency bands;
   a band reject filter unit comprised in the other inside in the housing, transmitting signals between the second and third connectors to reject predetermined frequency bands; and
   a coupling block disposed between the band pass filter unit and the band reject filter unit, and coupled the band pass filter unit and the band reject filter unit with the third connector, and to move the signal distortion phenomenon occurring due to unnecessary signals included in the signals to frequency bands other than predetermined frequency bands.

2. The diplex filter of claim 1, wherein the band pass filter unit comprises:
   a plurality of cavities formed by the grooves formed between the first and third connectors in the housing in the direction from the top surface to the bottom of the housing;
   a plurality of resonators installed in each of the cavities; and
   a plurality of partitions formed to partially open to form windows and configured to couple the cavities adjacent to each other.

3. A diplex filter for testing a base station mentioned in claim 2, wherein the resonator of the cavity disposed at the last position of the signal transmission path between the first and third connectors among the cavities is coupled with the coupling block in an open type to be connected electrically to the third connector.

4. The diplex filter of in claim 3, wherein the coupling block comprises:
   a cross cavity coupled with the resonator of the cavity located at the last position of the band pass filter unit;
   a cross resonator disposed in the cross cavity;
   a partition formed to partially open to form a window between the cavity located at the last position of the band pass filter unit and the cross cavities; and
   a cross transmission line coupled with the cross resonator in the cross cavity to be connected electrically to the third connector.

5. The diplex filter of claim 4, further comprising a dielectric material disposed between outer circumference surface of the cross resonator and the cross transmission line, wherein the dielectric material increases the amount of coupling.

6. The diplex filter of any one of claims 2 to 5, wherein the band reject filter unit comprises:
   a plurality of cavities formed by the grooves formed between the first and third connectors in the housing in the direction from the top surface to the bottom of the housing;
   a plurality of resonators installed in each of the cavities;
   a plurality of partitions that are partially open to form windows so that the cavities adjacent to each other can be coupled; and
   a plurality of transmission lines installed on the windows and arranged side by side on one side of the resonators so that signals can be transmitted between the second and third connectors.

7. The diplex filter of claim 6, wherein the housing further comprises a plurality of passageways to couple some of the cavities of the band reject filter, wherein the passageways respectively comprise a connection bar that is connected to the transmission lines and installed inside the passageways.

* * * * *